(12) United States Patent
Hosaka (10) Patent No.: US 10,149,412 B2
(45) Date of Patent: Dec. 4, 2018

(54) REFRIGERANT SUPPLY DEVICE, COOLING DEVICE, AND COOLING SYSTEM

(71) Applicant: NEC Platforms, Ltd., Kawasaki-shi, Kanagawa (JP)

(72) Inventor: Tadao Hosaka, Kanagawa (JP)

(73) Assignee: NEC PLATFORMS, LTD, Kanagawa (JP)

( * ) Notice: Subject to any disclaimer, the term of this patent is extended or adjusted under 35 U.S.C. 154(b) by 0 days.

(21) Appl. No.: 15/512,910

(22) PCT Filed: Oct. 14, 2015

(86) PCT No.: PCT/JP2015/005204
§ 371 (c)(1),
(2) Date: Mar. 21, 2017

(87) PCT Pub. No.: WO2016/059800
PCT Pub. Date: Apr. 21, 2016

(65) Prior Publication Data
US 2017/0311489 A1    Oct. 26, 2017

(30) Foreign Application Priority Data
Oct. 17, 2014   (JP) .................................. 2014-212152

(51) Int. Cl.
*F28D 15/00*    (2006.01)
*H05K 7/20*    (2006.01)
(Continued)

(52) U.S. Cl.
CPC ....... *H05K 7/20818* (2013.01); *F25B 23/006* (2013.01); *F28D 15/02* (2013.01);
(Continued)

(58) Field of Classification Search
CPC .......... F25B 1/00; F25B 43/043; F25B 41/00; F25B 23/006; H05K 7/20818; H05K 7/20;
(Continued)

(56) References Cited

U.S. PATENT DOCUMENTS 3,449,923 A * 6/1969 Kivioja .................... F25B 41/00
137/503
3,592,017 A * 7/1971 Lipman ................. F25B 43/043
62/195

(Continued)

FOREIGN PATENT DOCUMENTS

JP    S62-052777 U    4/1987
JP    S63-14058 A    1/1988
(Continued)

OTHER PUBLICATIONS

International Search Report for PCT Application No. PCT/JP2015/005204, dated Dec. 15, 2015.
(Continued)

*Primary Examiner* — Davis Hwu (57) ABSTRACT

A refrigerant supply device with a small lateral width and a capacity to supply refrigerant evenly among heat receivers disposed in multiple tiers needs to be provided.

A refrigerant supply device for distributing, by force of gravity, liquid phase refrigerant to heat receivers disposed in a plurality of tiers includes: a first conduit for supplying the refrigerant to the heat receivers; a second conduit provided in parallel with the first conduit; a first aperture provided in the first conduit for supplying the refrigerant to one of the heat receivers; a first blocking means provided below the first aperture for blocking the first conduit; a first communication opening provided above the first aperture and communicating the first conduit and the second conduit; a second communication opening provided below the first
(Continued)

blocking means and communicating the first conduit and the second conduit; and a second blocking means provided below the second communication opening for blocking the second conduit.

15 Claims, 8 Drawing Sheets

(51) Int. Cl.
    *F28D 15/02*     (2006.01)
    *G06F 1/20*     (2006.01)
    *F28F 9/02*     (2006.01)
    *F25B 23/00*     (2006.01)

(52) U.S. Cl.
    CPC .............. *F28F 9/0204* (2013.01); *G06F 1/20* (2013.01); *H05K 7/20* (2013.01); *H05K 7/20327* (2013.01)

(58) Field of Classification Search
    CPC ....... H05K 7/20327; F28D 15/02; G06F 1/20; F28F 9/0204
    USPC .................................................... 165/104.21
    See application file for complete search history.

(56) References Cited

U.S. PATENT DOCUMENTS

| | | | |
|---|---|---|---|
| 3,955,374 A * | 5/1976 | Zearfoss, Jr. ............. | F25B 1/00 |
| | | | 62/113 |
| 5,228,315 A | 7/1993 | Nagasaka et al. | |
| 2005/0006069 A1 | 1/2005 | Kamiyama et al. | |
| 2015/0305209 A1 | 10/2015 | Inaba et al. | |

FOREIGN PATENT DOCUMENTS

| | | |
|---|---|---|
| JP | H04-294835 A | 10/1992 |
| JP | H05-312361 A | 11/1993 |
| JP | H06-195130 A | 7/1994 |
| JP | 2004-340441 A | 12/2004 |
| JP | 2011-075115 A | 4/2011 |
| JP | 2014-126273 A | 7/2014 |
| WO | 2014/087635 A1 | 6/2014 |

OTHER PUBLICATIONS

English translation of Written opinion for PCT Application No. PCT/JP2015/005204.
Extended European Search Report for EP Application No. EP15851419.0 dated Jul. 2, 2018.

* cited by examiner

REFRIGERANT SUPPLY DEVICE, COOLING DEVICE, AND COOLING SYSTEM

This application is a National Stage Entry of PCT/JP2015/005204 filed on Oct. 14, 2015, which claims priority from Japanese Patent Application 2014-212152 filed on Oct. 17, 2014, the contents of all of which are incorporated herein by reference, in their entirety.

TECHNICAL FIELD

The present invention relates to a refrigerant supply device, a cooling device, and a cooling system.

BACKGROUND ART

With the development of information society in recent years, the amount of data is expected to increase greatly. To respond to the expected increase in the amount of data, it is necessary to install many high-performance servers and other electronic devices. Generally, high-performance electronic devices consume a large amount of electric power. And most of the electric power consumption of the electronic devices is converted into heat. Therefore, installing high-performance electronic devices cause ambient temperature rising due to their exhaust heat consequently. Particularly, in data centers having many electronic devices such as servers, the electronic devices emit a large amount of heat. In such a case, the electronic devices need to be cooled to maintain their functions, thus the air conditioning system requires a large amount of electric power. Because of that situation, there is a demand for a method of reducing load on the air conditioning of electronic devices.

As a technique to meet such a demand, there has been devised a method of circulating refrigerant without using a pump by utilizing phase changes of the refrigerant. This technique does not use any power for circulating the refrigerant and is very economical. In addition, by using an insulating refrigerant, short circuits are prevented even when there is a refrigerant leak. Thus, the technique of utilizing phase changes of the refrigerant is very effective for removing heat from servers and other electronic devices in data centers where these devices need to be working constantly.

Such electronic devices as described above are usually disposed in multiple tiers in a rack when used. In such a case, heat receivers for absorbing heat from the electronic devices are preferably disposed in multiple tiers corresponding to the tiers of electronic devices for higher efficiency.

A technique for refrigerant supply device for supplying refrigerant evenly among heat receivers disposed in multiple tiers as described above by utilizing force of gravity is disclosed in, for example, PTL 1. This technique employs a liquid distribution mechanism between liquid conduits for supplying liquid phase refrigerant and the heat exchanger. The liquid distribution mechanism is in a shape of container, and a branch conduit through which the refrigerant flows to lower tiers is connected to the liquid distribution mechanism at the same height as the predetermined level of liquid surface of the heat exchanger. When the refrigerant exceeds the predetermined level of liquid surface, the refrigerant overflows to the branch tube and flows down to the liquid distribution mechanism on a lower tier.

PTL 1 and PTL 2 disclose a configuration in which the liquid distribution mechanism is provided with a float and a valve that moves up and down with the float. In this configuration, when the refrigerant surface goes up to a predetermined level, the valve closes and subsequently the refrigerant flows down to the liquid distribution mechanism on a lower tier. PTL 3 also discloses a related technique.

CITATION LIST

Patent Literature

[PTL 1] Japanese Unexamined Patent Application Publication No. H5-312361
[PTL 2] Japanese Unexamined Patent Application Publication No. H6-195130
[PTL 3] International Publication No. 2015/087530

SUMMARY OF INVENTION

Technical Problem

However, PTL 1 and PTL 2 have problems as the following.

In PTL 1, the branch conduit is provided on a side of the liquid distribution mechanism to allow the refrigerant to flow down to the liquid distribution mechanism below. In order to allow the refrigerant to flow down from the side, the branch conduit is formed with a bent portion. The bent portion increases the lateral width of the refrigerant supply device.

Furthermore, with the configurations with a float and valve disclosed in PTL 1 and PTL 2, the float provided inside also increases the lateral width of the liquid distribution mechanism. These configurations also have a problem of making the mechanism of the refrigerant supply device more complicated.

The present invention has been made in view of the above problems, and an object of the invention is to provide a refrigerant supply device with a small lateral width and a capacity to supply refrigerant evenly among heat receivers disposed in multiple tiers.

Solution to Problem

To address the above-described problems, the refrigerant supply device of the present invention is a refrigerant supply device for distributing, by force of gravity, liquid phase refrigerant to heat receivers disposed in a plurality of tiers, the device including: a first conduit for supplying the refrigerant to the heat receivers; a second conduit provided in parallel with the first conduit; a first aperture provided in the first conduit for supplying the refrigerant to one of the heat receivers; a first blocking means provided below the first aperture for blocking the first conduit; a first communication opening provided above the first aperture and communicating the first conduit and the second conduit; a second communication opening provided below the first blocking means and communicating the first conduit and the second conduit; and a second blocking means provided below the second communication opening for blocking the second conduit.

Advantageous Effects of Invention

The present invention has effects of providing a refrigerant supply device with a small lateral width and a capacity to supply refrigerant evenly among heat receivers disposed in multiple tiers.

DESCRIPTION OF EMBODIMENTS

Example embodiments of the present invention will be described below in detail. It should be noted that, although technically preferable limitations are applied to the following example embodiments, it is not intended to limit the scope of the present invention to the following.

(First Example Embodiment)

Figure 1:
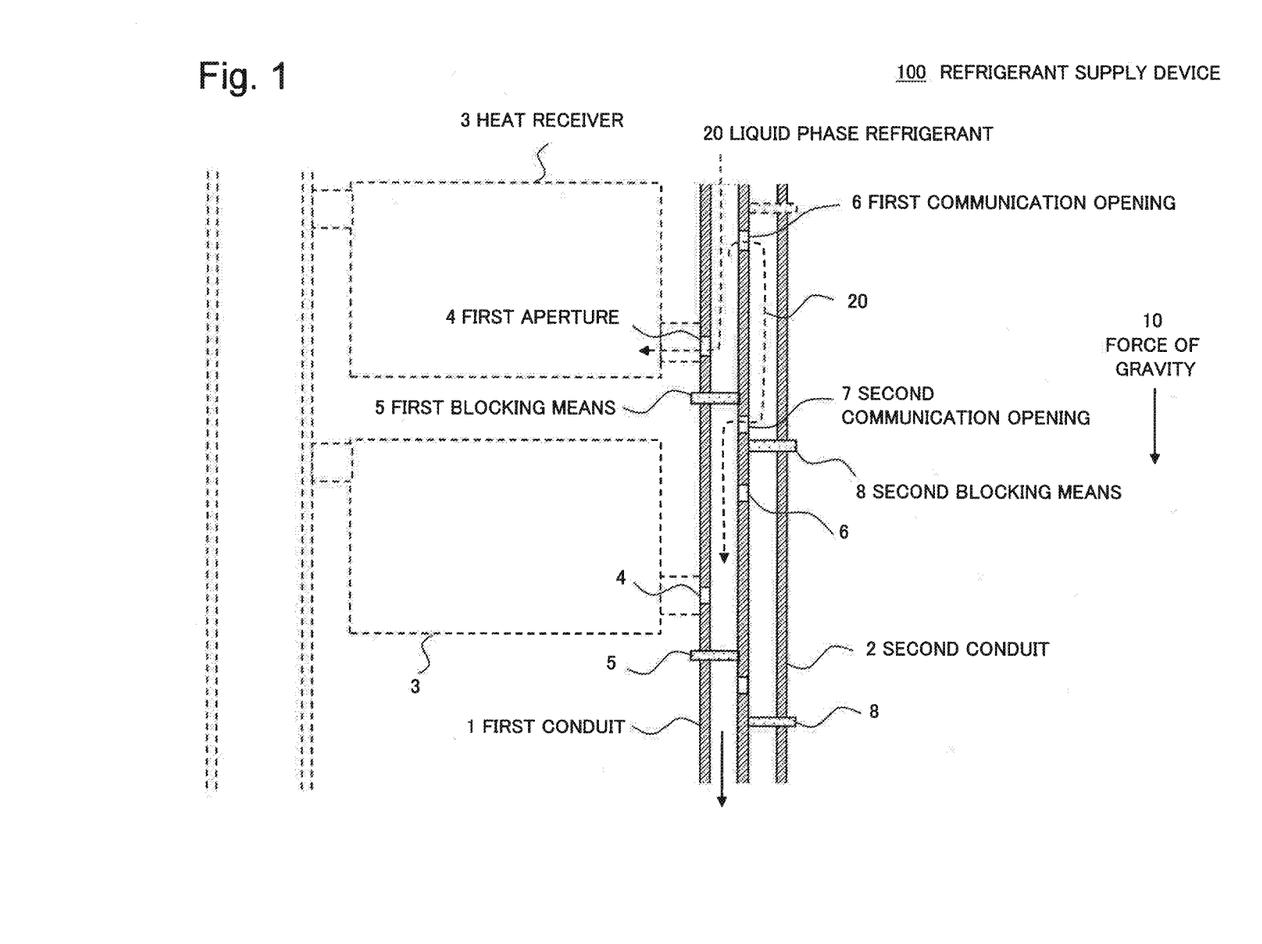
FIG. 1 is a cross-sectional view illustrating a first example embodiment.

FIG. 1 is a cross-sectional view illustrating a first example embodiment. The present example embodiment is a refrigerant supply device for distributing, by force of gravity 10, liquid phase refrigerant to heat receivers disposed in a plurality of tiers. A refrigerant supply device according to the present example embodiment 100 includes a first conduit 1 for supplying refrigerant to heat receivers, and a second conduit 2 provided in parallel with the first conduit 1 and sharing part of its conduit wall with the first conduit 1. The first conduit 1 includes a first aperture 4 through which the refrigerant flows to a heat receiver 3 and a first blocking means 5 provided below the first aperture 4 for blocking the first conduit 1. The refrigerant supply device 100 also includes a first communication opening 6 provided above the first aperture 4 and communicating the first conduit 1 and the second conduit 2. The refrigerant supply device 100 also includes a second communication opening 7 provided below the first blocking means 5 and communicating the first conduit 1 and the second conduit 2. The second conduit 2 includes a second blocking means 8 provided below the second communication opening 7 for blocking the second conduit 2. Herein, "lower", "lowest", "below", "down", and "downward" should be understood in accordance with the direction of the force of gravity 10.

When the liquid phase refrigerant 20 is supplied to the refrigerant supply device according to the present example embodiment 100, the liquid phase refrigerant 20 flows downward as indicated by the dashed arrow in the drawing. First, the liquid phase refrigerant 20 is blocked by the first blocking means 5, and flows through the first aperture 4 to a heat receiver 3. When the heat receiver 3 is filled with the refrigerant, the liquid surface reaches the first communication opening 6 and the refrigerant overflows to the second conduit. This flow is blocked by the second blocking means 8 and the refrigerant flows through the second communication opening 7 to the first conduit 1. This flow is blocked by the first blocking means 5 on the next tier, and the refrigerant is supplied through the first aperture 4 of the next tier to the heat receiver 3 of the next tier. The liquid phase refrigerant is supplied evenly among the heat receivers disposed in the plurality of tiers by repeating this process.

As described above, according to the present example embodiment, refrigerant is supplied evenly among heat receivers disposed in a plurality of tiers while using a space no wider than two straight tubes disposed in parallel. Furthermore, this is achieved by a simple structure with apertures and blocked parts at predetermined positions of the conduits.

(Second Example Embodiment)

Figure 2:
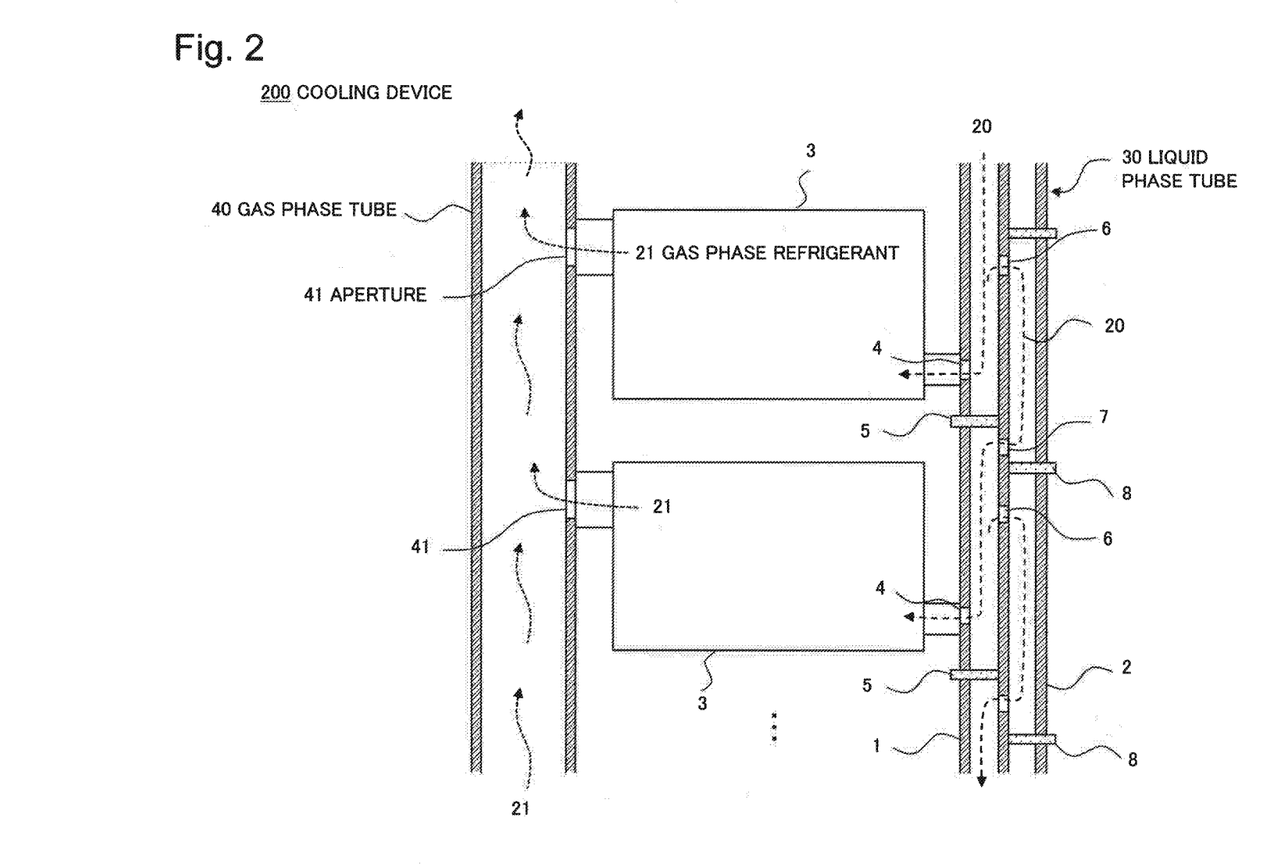
FIG. 2 is a cross-sectional view illustrating a second example embodiment.

FIG. 2 is a cross-sectional view illustrating a present example embodiment. The present example embodiment is a cooling device equipped with the refrigerant supply device 100 of the first example embodiment. Herein, the refrigerant supply device 100 is also referred to as liquid phase tube 30 for the sake of simplicity and in light of its function in the cooling device 200.

The cooling device 200 includes a liquid phase tube 30, heat receivers 3 disposed in a plurality of tiers, and a gas phase tube 40. The gas phase tube 40 is provided with apertures 41 at positions corresponding to respective heat exhaust ports of the heat receivers 3, and connected with the heat receivers 3. Note that the heat receivers 3 used in the present example embodiment is an application of so-called ebullient cooling system, that is, heat is absorbed when the liquid phase refrigerant 20 boils in the heat receivers 3. The heat receivers 3 need only to be suitable to the ebullient cooling system, and the present example embodiment can be realized regardless of what specific inner structure the heat receivers 3 may have.

The operation of the cooling device 200 of the present example embodiment will be described below. Upon supplied to the liquid phase tube 30 from above, the liquid phase refrigerant 20 is supplied through the first conduits 1 and then the first apertures 4 to the heat receivers 3. The liquid phase tube 30 supplies the liquid phase refrigerant 20 evenly among the heat receivers 3 disposed in a plurality of tiers in a similar manner as in the first example embodiment.

The heat receivers 3 receive heat from heat sources, and the liquid phase refrigerant 20 boils and turns into gas phase refrigerant 21 by undergoing a phase change. This lowers the temperature of the heat receivers 3. The gas phase refrigerant 21 flows through the apertures 41 into the gas phase tube 40. In the gas phase tube 40, the liquid phase refrigerant from the heat receivers moves upward by cubical expansion and buoyancy. Here, the refrigerant need not completely evaporate and a small amount of liquid phase refrigerant 20 may remain in the gas phase refrigerant 21. The gas phase refrigerant 21 is then cooled in a radiator not shown and flows back to the liquid phase tube 30. Through this cycle, cooling of the heat sources is achieved without using external power.

As described above, the present example embodiment enables a configuration of a cooling device that supplies liquid phase refrigerant evenly among heat receivers on a plurality of tiers and performs an efficient cooling of heat sources.

(Third Example Embodiment)

Figure 3:
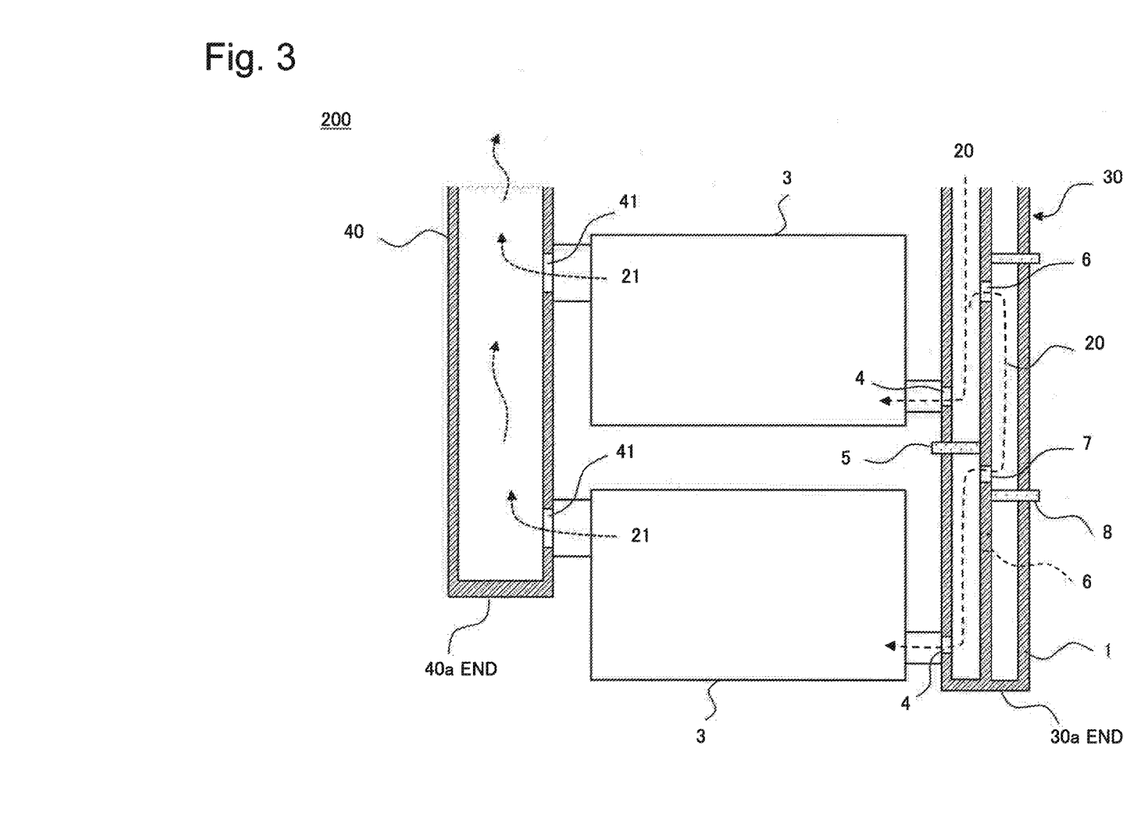
FIG. 3 is a cross-sectional view illustrating a third example embodiment.

FIG. 3 is a cross-sectional view illustrating a third example embodiment. The present example embodiment provides a configuration example of the cooling device 200 applied to a heat receiver 3 on the lowest tier. At the end 30a of the liquid phase tube 30 on the lowest tier, the first conduit 1 and the second conduit 2 are both blocked. The end 40a of the gas phase tube 40 is also blocked. It is not necessary to provide a first communication opening 6 at the lowest tier of the liquid phase tube 30 because the liquid phase refrigerant 20 need not be supplied further downward.

The lowest tier of the liquid phase tube 30 supplies the liquid phase refrigerant 20 to the heat receiver 3 of the lowest tier, and the lowest tier of the gas phase tube 40 receives the gas phase refrigerant from the heat receiver 3 of the lowest tier. Together with the radiator not shown, a closed circuit cooling system is thus formed.

As described above, the present example embodiment enables a circuit cooling system to be formed with a simple structure.

(Fourth Example Embodiment)

Figure 4:
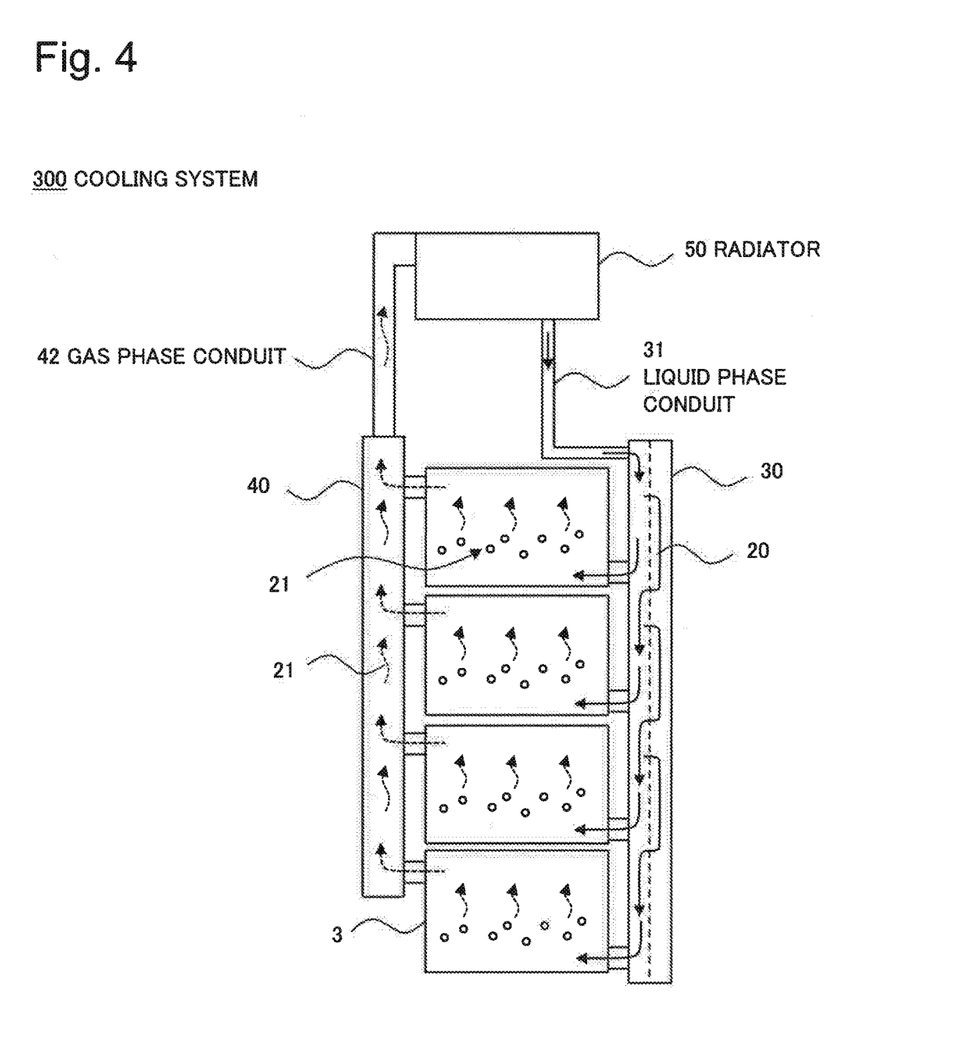
FIG. 4 is a block diagram illustrating a fourth example embodiment.

FIG. 4 is a block diagram illustrating a fourth example embodiment. The present example embodiment provides a configuration example of a cooling system 300 provided with a cooling device according to the second or third example embodiment. In the drawing, flows of the liquid phase refrigerant 20 and the gas phase refrigerant 21 are schematically illustrated. The liquid phase tube 30 is connected with a radiator 50 by a liquid phase conduit 31. The gas phase tube 40 is connected with the radiator 50 by a gas phase conduit 42. The liquid phase tube 30 and the gas phase tube 40 are connected with the plurality of heat receivers 3 and form a circuit type cooling system 300.

The operation of the cooling system 300 will be described below, starting from the radiator 50. First, liquid phase refrigerant is supplied from the radiator 50 to the liquid phase conduit 31 and then to the liquid phase tube 30. The liquid phase refrigerant 20 is supplied evenly among the heat receivers 3 from the liquid phase tube 30 in a manner similar to the first example embodiment. The flow of the liquid phase refrigerant 20 is indicated by the solid arrow. FIG. 4 illustrates an example with four heat receivers 3, but naturally the number of the heat receivers 3 is not limited thereto.

The liquid phase refrigerant 20 boils in the heat receivers 3 and turns to the gas phase refrigerant 21. The heat receivers 3 are cooled by this phase change and absorb heat from the heat sources. This process is schematically illustrated by bubbles and dashed arrows in FIG. 5. The gas phase refrigerant 21 then flows to the gas phase tube 40, and returns through the gas phase conduit 42 to the radiator 50. The gas phase refrigerant then returns to a liquid phase by releasing heat and is supplied to the liquid phase conduit 31 again.

As described above, the present example embodiment enables a cooling system in which refrigerant is supplied evenly among a plurality of heat receivers to be easily constructed.

(Fifth Example Embodiment)

Figure 5A:
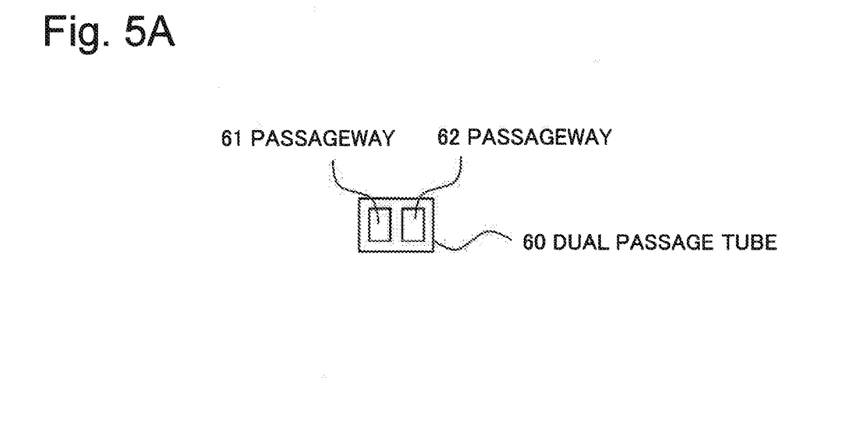
FIG. 5A is a latitudinal plan view of a dual passage tube used in a fifth example embodiment.
Figure 5B:
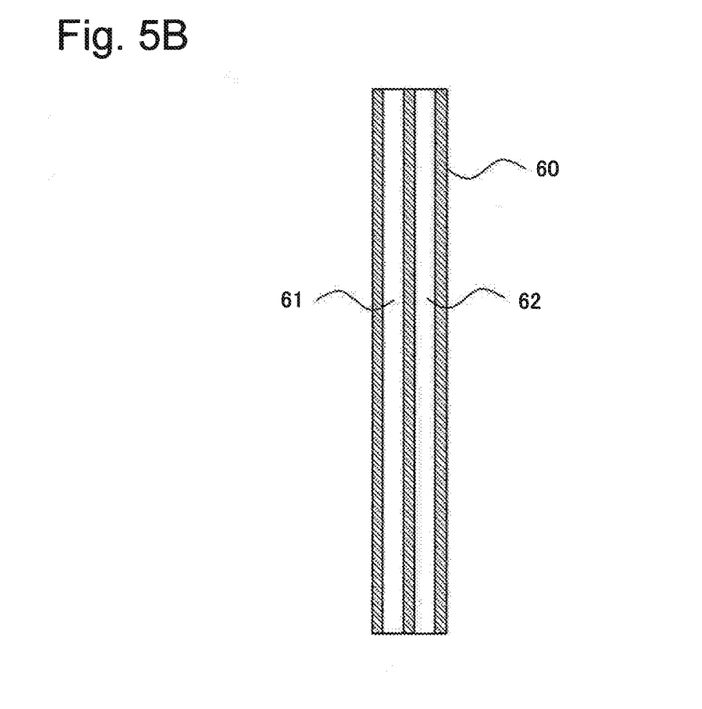
FIG. 5B is a longitudinal cross-sectional view of the dual passage tube used in the fifth example embodiment

The present example embodiment relates to a manufacturing method of the refrigerant supply device. FIGS. 5A and 5B are a plan view and a cross-sectional view of a dual passage tube used for production of the refrigerant supply device. FIG. 5A is a latitudinal plan view. As illustrated in the drawing, in the present example embodiment, a dual passage tube 60 having a passageway 61 and a passageway 62 is used. FIG. 5B is a longitudinal cross-sectional view. As illustrated in the drawing, this tube is a straight tube having two passageways. This type of dual passage tube 60 may be produced by, for example, extrusion. It also may be produced by piercing and rolling, reducing rolling, presswork and welding or the like. Methods for manufacturing the dual passage tube 60 are not particularly limited but, to avoid any leakage, there should be no defects such as a void on the conduit wall.

Figure 6A:
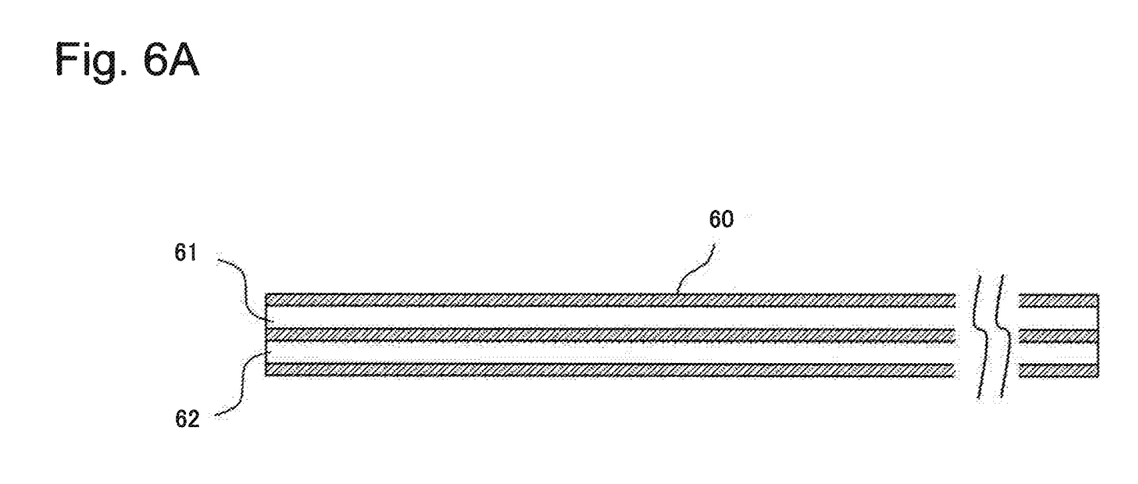
FIG. 6A is a cross-sectional view illustrating a process in the fifth example embodiment.
Figure 6B:
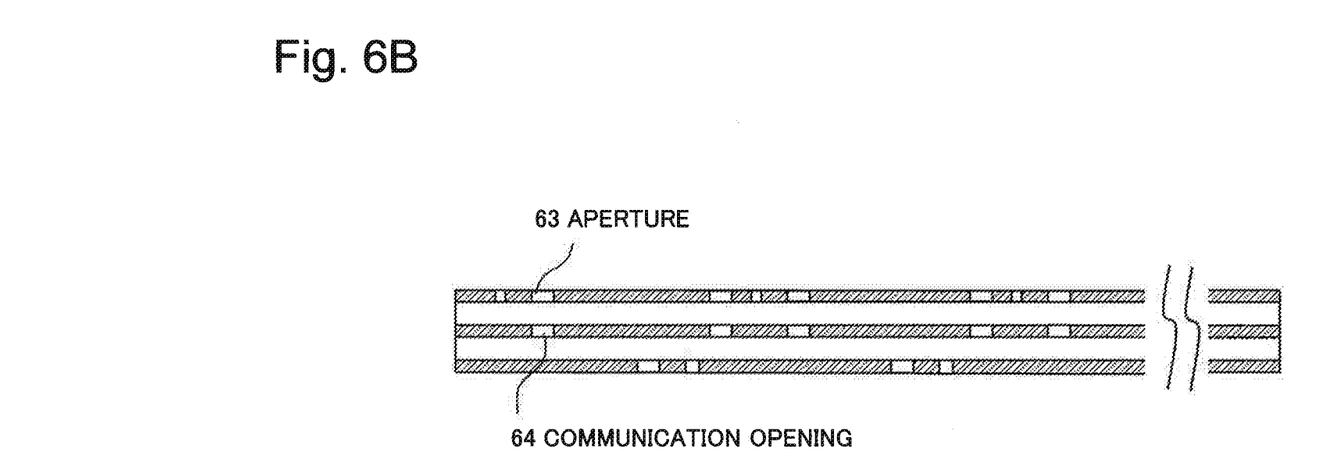
FIG. 6B is a cross-sectional view illustrating another process in the fifth example embodiment.
Figure 6C:
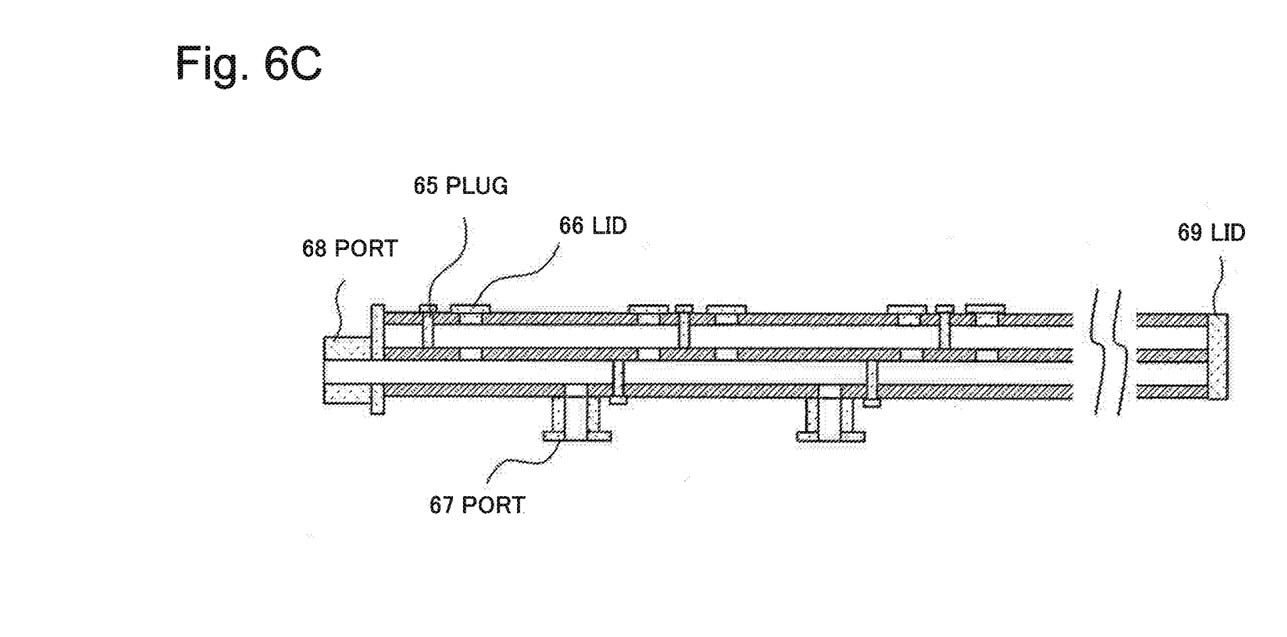
FIG. 6C is a cross-sectional view illustrating yet another process in the fifth example embodiment.

FIGS. 6A, 6B, and 6C are cross-sectional views illustrating the manufacturing method of the refrigerant supply device. First, as illustrated in FIG. 6A, a straight dual passage tube 60 with passageways 61, 62 is made ready for processing.

Next, as illustrated in FIG. 6B, apertures 63 and communication openings 64 are formed at predetermined positions.

Next, as illustrated in FIG. 6C, plugs 65 are provided at positions where the conduits should be blocked, and lids 66 are provided for apertures 63 located outwardly at positions corresponding to the communication openings 64. The apertures 63 to be connected with the heat receivers are provided with ports 67 for the connection with the heat receivers, while the end of the dual passage tube 60 to be connected with the liquid phase conduit is provided with a port 68. Depending on the manners of connection with the heat receivers and connection conduits, ports 67, 68 may be unnecessary. The lower end of the dual passage tube 60 is provided with a lid 69. Thus the manufacturing of the refrigerant supply device is complete.

As described above, simply by forming apertures in a dual passage tube and providing plugs and other members, the refrigerant supply device can be manufactured.

Hereinabove, the present invention has been described using the above-described example embodiments as exemplary examples. The present invention, however, is not limited to the above-described example embodiments. In other words, various aspects that can be recognized by those skilled in the art can be applied to the present invention within the scope of the invention.

This application claims priority based on Japanese Patent Application No. 2014-212152, filed Oct. 17, 2014, the disclosure of which is incorporated herein by reference in its entirety.

REFERENCE SIGNS LIST 1 first conduit
2 second conduit
3 heat receiver
4 first aperture
5 first blocking means
6 first communication opening
7 second communication opening
8 second blocking means
10 force of gravity
20 liquid phase refrigerant
21 gas phase refrigerant
30 liquid phase tube
31 liquid phase conduit
40 gas phase tube
41 aperture
42 gas phase conduit
50 radiator
60 dual passage tube
61, 62 passageway
63 aperture
64 communication opening
65 plug
66, 69 lid
67, 68 port
100 refrigerant supply device
200 cooling device
300 cooling system

What is claimed is:

1. A refrigerant supply device for distributing, by force of gravity, liquid phase refrigerant to heat receivers disposed in a plurality of tiers, the device comprising:

a first conduit for supplying the refrigerant to the heat receivers;

a second conduit provided in parallel with the first conduit;

a first aperture provided in the first conduit for supplying the refrigerant to one of the heat receivers;

a first blocking object provided below the first aperture for blocking the first conduit;

a first communication opening provided above the first aperture and communicating the first conduit and the second conduit;

a second communication opening provided below the first blocking object and communicating the first conduit and the second conduit; and a second blocking object provided below the second communication opening for blocking the second conduit.

2. A refrigerant supply device comprising:
a plurality of refrigerant supply devices according to claim 1 in a series.

3. The refrigerant supply device according to claim 1, further comprising lids for respectively blocking the first conduit and the second conduit at ends closer to a lowest tier of the first conduit and the second conduit.

4. A cooling device comprising:
a refrigerant supply device according to claim 1,
a heat receiver connected with the first aperture, and
a gas phase tube connected with the heat receiver for exhausting
the gas phase refrigerant from the heat receiver.

5. A cooling system comprising:
a cooling device according to claim 4 and
a radiator interposed between the gas phase tube and the refrigerant supply device for releasing heat of the refrigerant.

6. The cooling system according to claim 5,
wherein the refrigerant used in the cooling system is an insulating material.

7. A method of supplying refrigerant using a refrigerant supply device according to claim 1, comprising:
storing the refrigerant in the first conduit by the first blocking object;
supplying the refrigerant through the first aperture to one of the heat receivers;
allowing the refrigerant to overflow through the first communication opening to the second conduit;
keeping the refrigerant in the second conduit by the second blocking object; and
allowing the refrigerant to overflow through the second communication opening to the first conduit.

8. A method of supplying refrigerant, comprising:
conducting the method of supplying refrigerant according to claim 7 in a series to supply the refrigerant evenly among a plurality of the heat receivers.

9. A method of controlling the cooling system according to claim 5, comprising:
supplying liquid phase refrigerant from the refrigerant supply device to the heat receivers;
bringing the refrigerant to a boil by giving the heat receivers heat from an object to be cooled;
returning the evaporated refrigerant through the gas phase tube to the radiator;
liquefying the refrigerant by releasing heat of the refrigerant with the radiator; and
returning the refrigerant to the refrigerant supply device.

10. The refrigerant supply device according to claim 2, further comprising lids for respectively blocking the first conduit and the second conduit at ends closer to a lowest tier of the first conduit and the second conduit.

11. A cooling device comprising:
a refrigerant supply device according to claim 2,
a heat receiver connected with the first aperture, and
a gas phase tube connected with the heat receiver for exhausting the gas phase refrigerant from the heat receiver.

12. A cooling device comprising:
a refrigerant supply device according to claim 3,
a heat receiver connected with the first aperture, and
a gas phase tube connected with the heat receiver for exhausting the gas phase refrigerant from the heat receiver.

13. A method of supplying refrigerant using a refrigerant supply device according to claim 2, comprising:
storing the refrigerant in the first conduit by the first blocking object;
supplying the refrigerant through the first aperture to one of the heat receivers;
allowing the refrigerant to overflow through the first communication opening to the second conduit;
keeping the refrigerant in the second conduit by the second blocking object; and
allowing the refrigerant to overflow through the second communication opening to the first conduit.

14. A method of supplying refrigerant using a refrigerant supply device according to claim 3, comprising:
storing the refrigerant in the first conduit by the first blocking object;
supplying the refrigerant through the first aperture to one of the heat receivers;
allowing the refrigerant to overflow through the first communication opening to the second conduit;
keeping the refrigerant in the second conduit by the second blocking object; and
allowing the refrigerant to overflow through the second communication opening to the first conduit.

15. A method of controlling the cooling system according to claim 6, comprising:
supplying liquid phase refrigerant from the refrigerant supply device to the heat receivers;
bringing the refrigerant to a boil by giving the heat receivers heat from an object to be cooled;
returning the evaporated refrigerant through the gas phase tube to the radiator;
liquefying the refrigerant by releasing heat of the refrigerant with the radiator; and
returning the refrigerant to the refrigerant supply device.

\* \* \* \* \*